(12) United States Patent
Usugi et al.

(10) Patent No.: US 8,625,730 B2
(45) Date of Patent: Jan. 7, 2014

(54) PHASE LOCKED LOOP, CDR CIRCUIT, AND RECEIVING CIRCUIT

(75) Inventors: Tatsunori Usugi, Inagi (JP); Daisuke Hamano, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 267 days.

(21) Appl. No.: 13/180,620

(22) Filed: Jul. 12, 2011

(65) Prior Publication Data

US 2012/0051480 A1    Mar. 1, 2012

(30) Foreign Application Priority Data

Sep. 1, 2010    (JP) ................................. 2010-195282

(51) Int. Cl.
*H03D 3/24*    (2006.01)

(52) U.S. Cl.
USPC ........... 375/376; 375/294; 375/316; 375/327; 375/371; 375/373

(58) Field of Classification Search
USPC ......... 375/215, 219, 259, 286, 294, 316, 327, 375/354, 371, 373, 376
See application file for complete search history.

(56) References Cited

U.S. PATENT DOCUMENTS

| | | | | |
|---|---|---|---|---|
| 6,853,223 B2 * | 2/2005 | Ebuchi et al. | ................. | 327/156 |
| 7,551,037 B2 * | 6/2009 | Isobe et al. | .................. | 331/16 |
| 7,692,496 B2 * | 4/2010 | Tseng | ............... | 331/11 |
| 7,738,618 B2 * | 6/2010 | Jacobsson et al. | ............ | 375/375 |
| 7,920,000 B2 * | 4/2011 | Kawashima | ................... | 327/156 |
| 7,945,010 B2 * | 5/2011 | Shin | .............................. | 375/371 |
| 8,143,925 B2 * | 3/2012 | Ahn et al. | ....................... | 327/158 |
| 8,149,974 B2 * | 4/2012 | Arima et al. | ................... | 375/355 |
| 8,188,776 B2 * | 5/2012 | Kumagai | ....................... | 327/156 |
| 8,258,878 B2 * | 9/2012 | Yen et al. | ........................... | 331/2 |
| 8,373,470 B2 * | 2/2013 | Trivedi et al. | .................. | 327/158 |
| 2003/0231064 A1 * | 12/2003 | Sano | ............................. | 331/1 A |
| 2007/0104292 A1 * | 5/2007 | Gregorius | ..................... | 375/327 |
| 2007/0254600 A1 * | 11/2007 | Ishii | ............................... | 455/76 |
| 2009/0167384 A1 * | 7/2009 | Sohn et al. | ..................... | 327/156 |
| 2009/0245449 A1 | 10/2009 | Umai et al. | | |
| 2010/0052747 A1 * | 3/2010 | Sugano et al. | ................. | 327/157 |
| 2010/0213991 A1 * | 8/2010 | Fukuda | ......................... | 327/117 |
| 2010/0283549 A1 * | 11/2010 | Wang | .............................. | 331/34 |

OTHER PUBLICATIONS

Toifl et al., A 72Mw 0.03MM$^2$ Inductorless 40Gb/s CDR in 65nm SOI CMOS, 2007 IEEE International Solid-State Circuits Conference, Digest of Technical Papers (2007) p. 226-227 and 598.

* cited by examiner

*Primary Examiner* — Hirdepal Singh
(74) *Attorney, Agent, or Firm* — Miles & Stockbridge P.C.

(57) ABSTRACT

In a phase locked loop, frequency-divided clocks each of which is given a phase difference of at least one cycle of a feedback clock are inputted to a first phase comparator and a second phase comparator, respectively, which are made to perform phase comparison with a reference clock. Then, outputs of the first and second phase comparators are weighted by a result of the phase comparison of a receive signal and the feedback clock, and phase adjustment of the feedback clock is phase adjusted using the weighted outputs. Thereby, it is possible to lower a frequency of the reference clock and consequently to suppress power consumption.

9 Claims, 15 Drawing Sheets

STEP4: OVERFLOW PROCESS

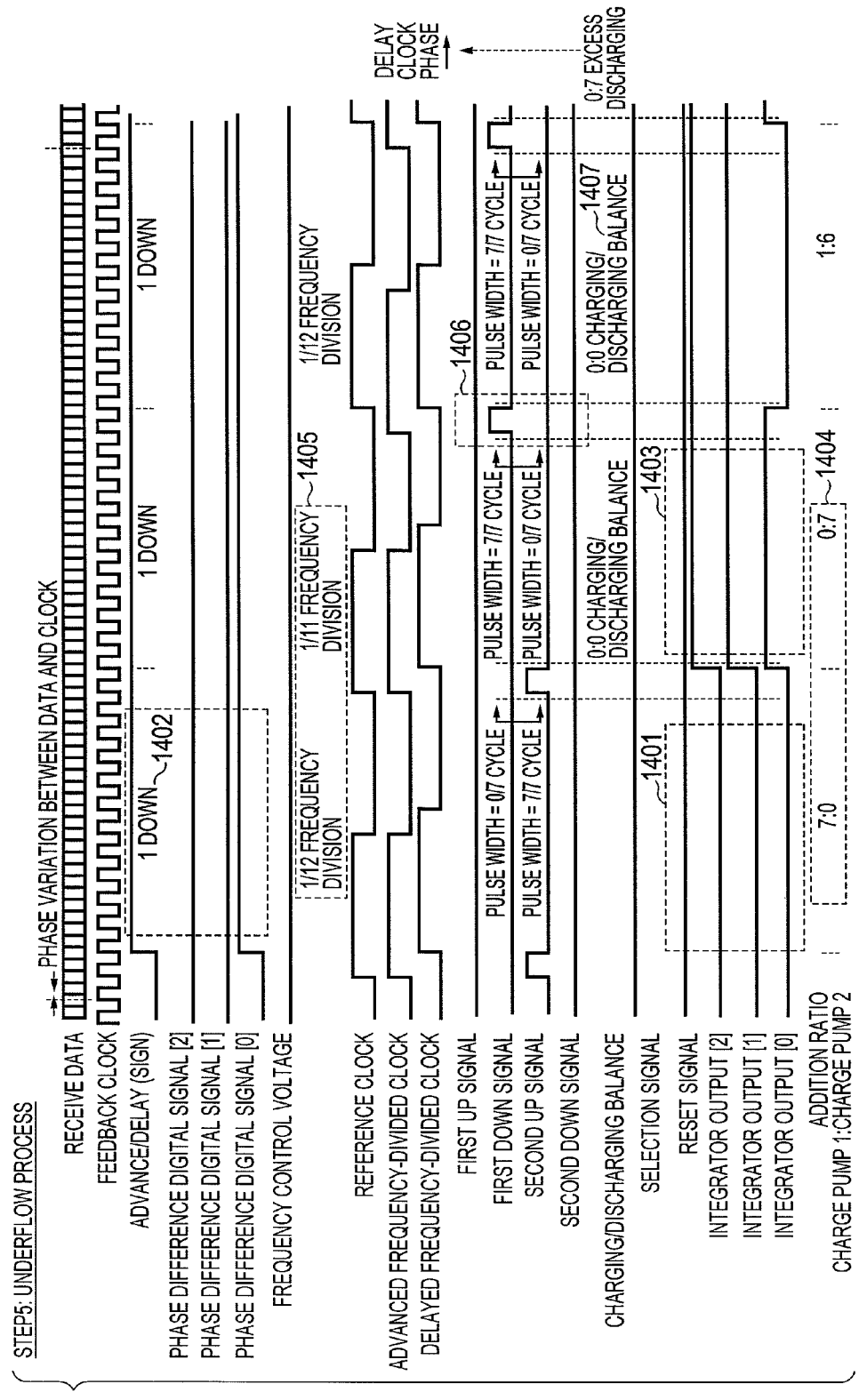

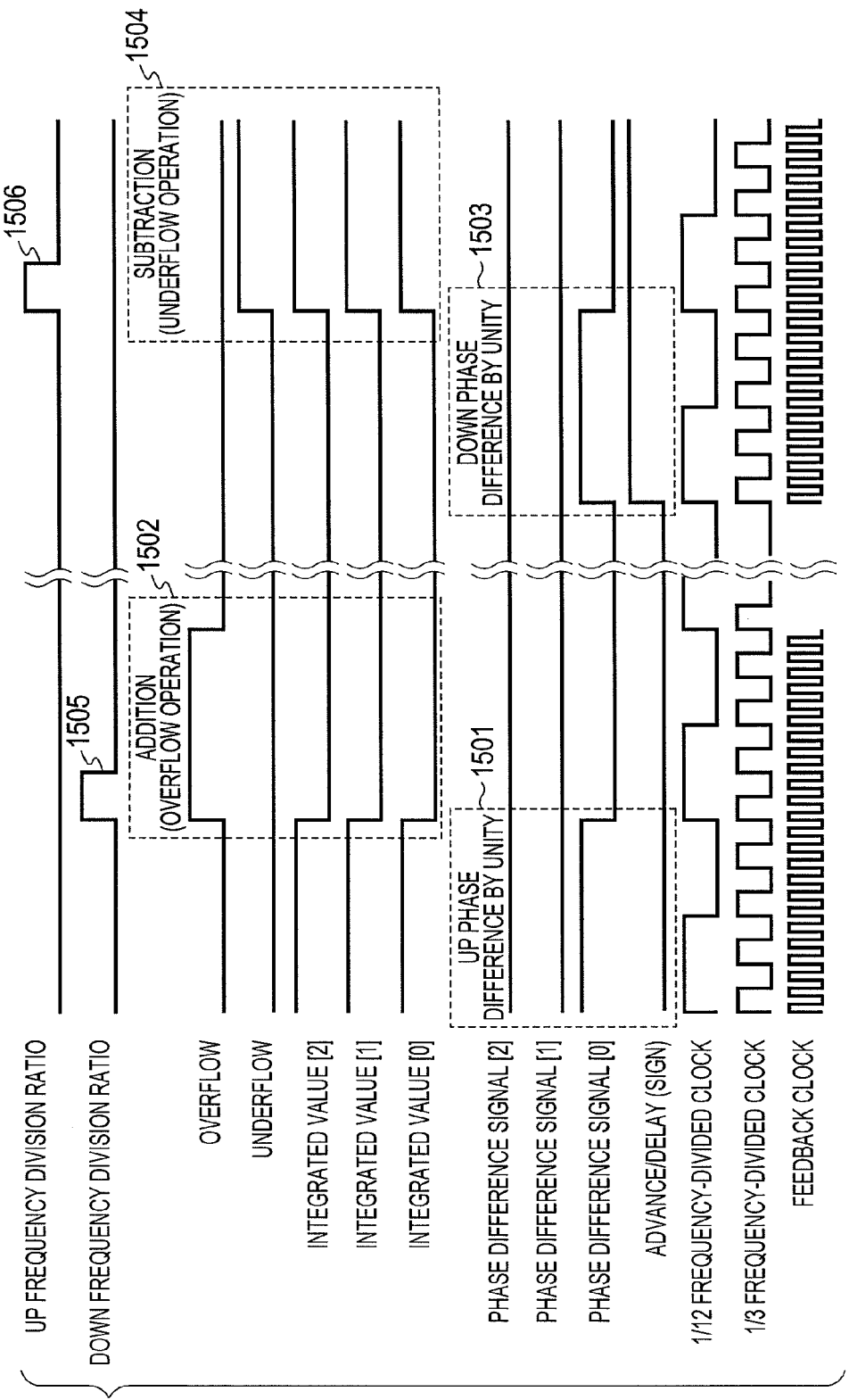

PHASE LOCKED LOOP, CDR CIRCUIT, AND RECEIVING CIRCUIT

CLAIM OF PRIORITY

The present application claims priority from Japanese patent application JP 2010-195282 filed on Sep. 1, 2010, the content of which is hereby incorporated by reference into this application.

FIELD OF THE INVENTION

The present invention relates to a phase locked loop, a CDR circuit, and a receiving circuit.

BACKGROUND OF THE INVENTION

The phase locked loop is used in order to generate a signal that synchronizes with an input signal. For example, a receiving part of serial data in serial transmission uses the clock and data recovery (CDR) circuit in order to take the received data in a register, and the CDR circuit uses a phase locked loop that has a clock generation circuit having a frequency almost equal to a receiving data rate and being capable of adjusting, its phase by a control signal and a phase comparator for comparing phases of the data and a generated clock and outputting a phase error, and generates a clock synchronizing with the data by controlling the clock generation circuit so that a phase error signal outputted from the phase comparator may be minimized.

Regarding the phase locked loop, US2009/0245449 discloses a technology that, having a frequency synthesizer for multiplying a reference clock inputted from the outside and a phase interpolator for generating a clock that is phase interpolated by the output, generates a synchronizing clock suitable for taking in input serial data by controlling an interpolated value of the phase interpolator according to a phase comparison result between the input serial data and an output clock of the phase interpolator. Moreover, Thomas Toifl et al., "A 72 mW 0.03 mm² Inductorless 40 Gbps CDR in 65 nm SOI CMOS," 2007 IEEE International Solid-State Circuits Conference, DIGEST OF TECHNICAL PAPERS (2007) p. 226 discloses a technology that, having a PLL for generating a clock synchronized in phase with a reference clock inputted from the outside and a voltage controller for controlling a voltage value inputted to the voltage controlled oscillator that constitutes the PLL, generates a synchronizing clock suitable for taking in serial data by controlling a voltage of the voltage controller according to the phase comparison result between the input serial data and the generated clock.

SUMMARY OF THE INVENTION

In recent years, higher speed of a phase comparison circuit is being desired. For example, in serial transmissions, power consumption poses a problem with speed-enhancement of operating frequencies and an increase in the number of serial channels. However, with a technology disclosed in US2009/0245449, since a high-speed clock that a frequency synthesizer created by multiplication of a clock is distributed, the power consumption also becomes larger with increasing operating frequency. Moreover, with the technology disclosed by Thomas Toifl et al, "A 72 mW 0.03 mm² Inductorless 40 Gbps CDR in 65 nm SOI CMOS," 2007 IEEE International Solid-State Circuits Conference, DIGEST OF TECHNICAL PAPERS (2007) p. 226, since a frequency of the reference clock inputted from the outside becomes larger with increasing operating frequency, the power consumption becomes large.

The invention of this application has an object to provide a phase locked loop capable of suppressing the power consumption.

An outline of a representative aspect among aspects of the invention disclosed in this application is as shown below.

The phase locked loop according to one aspect of the present invention has, in order to perform phase locking between a receive signal and a feedback clock: a voltage controlled oscillator for generating the feedback clock; frequency divider for generating a first frequency-divided clock and a second frequency-divided clock from the feedback clock; a first phase comparator to which the reference clock and the first frequency-divided clock are inputted; a second phase comparator to which the reference clock and the second frequency-divided clock are inputted; and a third phase comparator to which the feedback clock and the receive signal are inputted. Between the first frequency-divided clock and the second frequency-divided clock, a phase difference of at least one cycle of the feedback clock is given, and an output of the first phase comparator and an output of the second phase comparator are weighted based on an output of the third phase comparator and are inputted to the voltage controlled oscillator.

The phase locked loop of the present invention is capable of suppressing the power consumption by making the frequency of the reference clock lower than a frequency of the receive signal.

BRIEF DESCRIPTION OF THE DRAWINGS

FIG. 14 is a diagram showing the operation of the embodiment of the phase locked loop of the present invention.

FIG. 15 is a diagram showing the operation of the embodiment of the phase locked loop of the present invention.

DETAILED DESCRIPTION OF THE PREFERRED EMBODIMENTS

Hereinafter, the present invention will be described in detail based on embodiments.

First Embodiment

Figure 1:
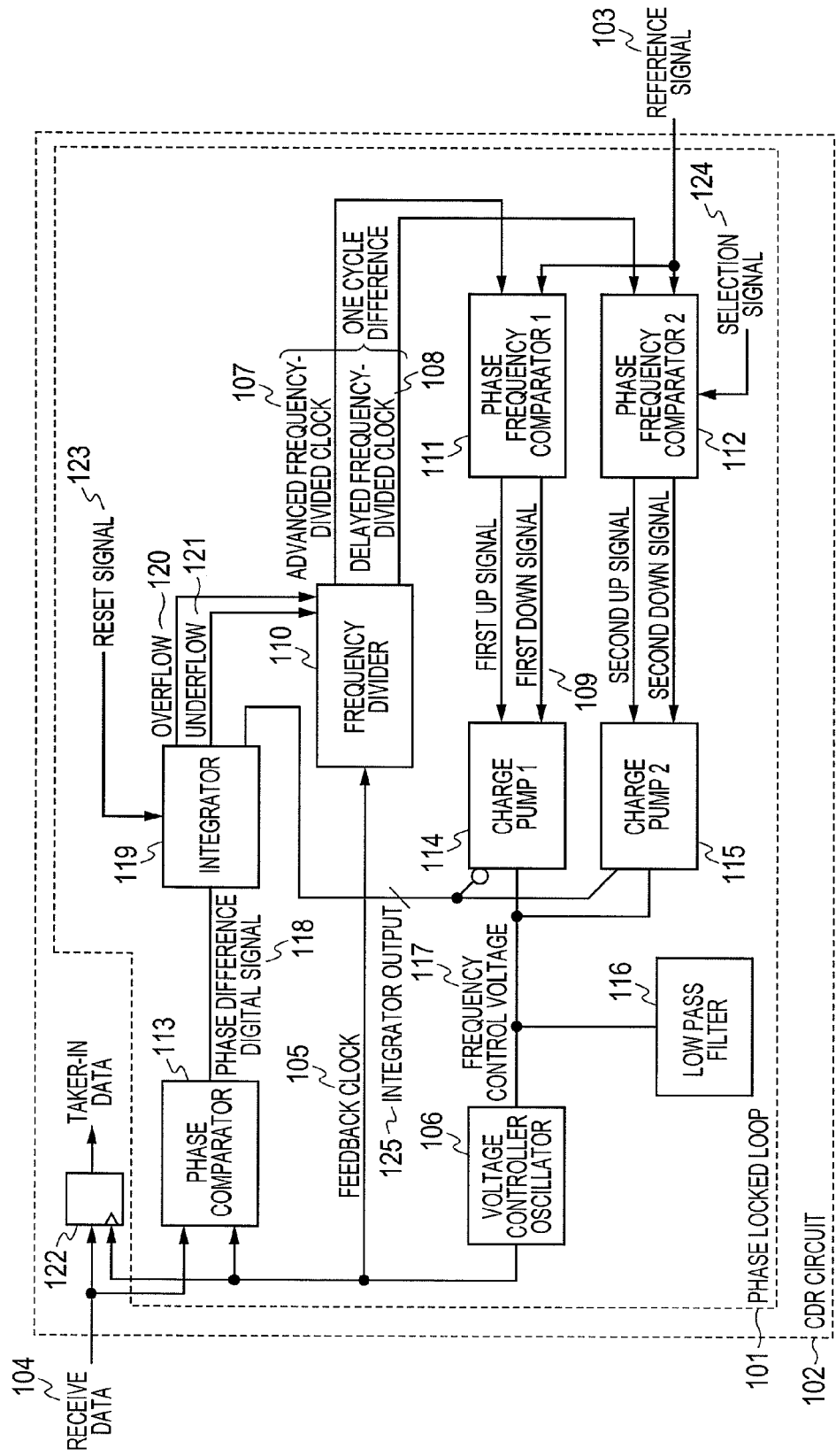
FIG. 1 is a block diagram showing an embodiment of a phase locked loop and a CDR circuit of the present invention.

FIG. 1 shows a block diagram of a CDR circuit 102 equipped with a phase locked loop 101 as an embodiment of the present invention. A reference clock 103 serving as a reference clock and receive data 104 that is a receive signal are inputted to the CDR circuit 102. The phase locked loop 101 that the CDR circuit 102 has is equipped with a voltage controlled oscillator 106 for generating a feedback clock 105, a frequency divider 110 for generating a first frequency-divided clock (an advanced frequency-divided clock) 107 and a second frequency-divided clock (an delayed frequency-divided clock) 108 from the feedback clock 105, a first phase frequency comparator 111 to which the reference clock 103 and the first frequency-divided clock 107 are inputted, a second phase frequency comparator 112 to which the reference clock 103 and the second frequency-divided clock 108 are inputted, and a phase comparator 113 to which the feedback clock 105 and the receive data 104 are inputted. Incidentally, in this embodiment, although the first phase frequency comparator and the second phase frequency comparator were used as the phase comparator, these were introduced so that the frequency comparator used for performing a frequency comparison operation prior to a phase comparison operation of the phase locked loop 101 could be used as a phase comparator, as will be described later. Therefore, a frequency comparator maybe separately provided for the frequency comparison operation. For the phase comparison operation of the present invention, the first phase frequency comparator 111 and the second phase frequency comparator 112 may be the phase comparators, respectively.

An output of the first phase frequency comparator 111 is connected to an input of a charge pump 114. An output of the second phase frequency comparator 112 is connected to an input of a charge pump 115. Outputs of the charge pumps 114 and 115 are connected to a low pass filter 116 and its output is inputted to the voltage controlled oscillator 106 as a frequency control voltage 117.

Between the first frequency-divided clock 107 and the second frequency-divided clock 108, a phase difference of at least one cycle of the feedback clock 105 is given. As will be described later, since the phase difference is expressed with a finite number of bits and is used for digital control, in the case where the phase difference of one cycle is given, phase adjustment can be performed more finely than in the case where the phase difference larger than it is given, which is advantageous for improvement of phase accuracy; therefore, the phase difference shall be the phase difference of one cycle in this embodiment. In this embodiment, the first frequency-divided clock 107 advances in phase from the second frequency-divided clock 108. With the above configuration, the phase locked loop 101 has configurations of two frequency synthesizers each of which synthesizes with the same frequency at a different phase.

The phase comparator 113 outputs a phase difference between the receive data 104 and the feedback clock 105 as a digital signal 118 expressed in a multibit form. As a concrete circuit, there can be enumerated a bang-bang type circuit with a binary expression and a linear phase comparator that expresses phase difference information with multivalues. The digital signal 118 is inputted to a digital integrator 119, which integrates phase difference information from the phase comparator 113 and varies output currents of the charge pumps 114 and 115 discretely. Here, the charge pump 114 is added with an inversion logic so that the charge pumps 114 and 115 may operate exclusively to an output of the integrator 119. Thereby, the output of the first phase frequency comparator 111 and the output of the second phase frequency comparator 112 are weighted based on an output of the phase comparator 113, and the weighted outputs are inputted to the voltage controlled oscillator 106. Moreover, an overflow signal 120 and an underflow signal 121 of the integrator 119 are inputted to the frequency divider 110.

Based on the output of the phase comparator 113, namely, the phase difference between the receive data 104 and the feedback clock 105, the phase locked loop 101 can automatically perform the phase adjustment of the feedback clock 105 through frequency control of the voltage controlled oscillator 106 by weighting respective outputs of phase comparison results of the first phase frequency comparator 111 for comparing phases of the advanced frequency-divided clock 107 and the reference clock 103 and the second phase frequency comparator 112 for comparing phases of the delayed frequency-divided clock 108 and the reference clock 103, and outputting them to the voltage controlled oscillator 106. Then, the CDR circuit 102 becomes able to take in data with a flip-flop 122 that inputs therein the receive data 104 and the feedback clock 105. At this time, since there is no necessity of making a frequency of the reference clock 103 comparable to a frequency of the receive data 104, the reference clock 103, for example, of about 100 MHz can be set for the input of the receive data 104 of a few GHz. Thus, since the frequency of the reference clock 103 can be made lower than the frequency of the receive data 104, it is possible to suppress power consumption of the phase locked loop 101 and the CDR circuit 102.

A reset signal 123 inputted to the integrator 119 and the selection signal 124 inputted to the second phase frequency comparator 112 are control signals used for operations before the phase locked loop 101 enters into the phase comparison operation as will be described later.

Figure 3:
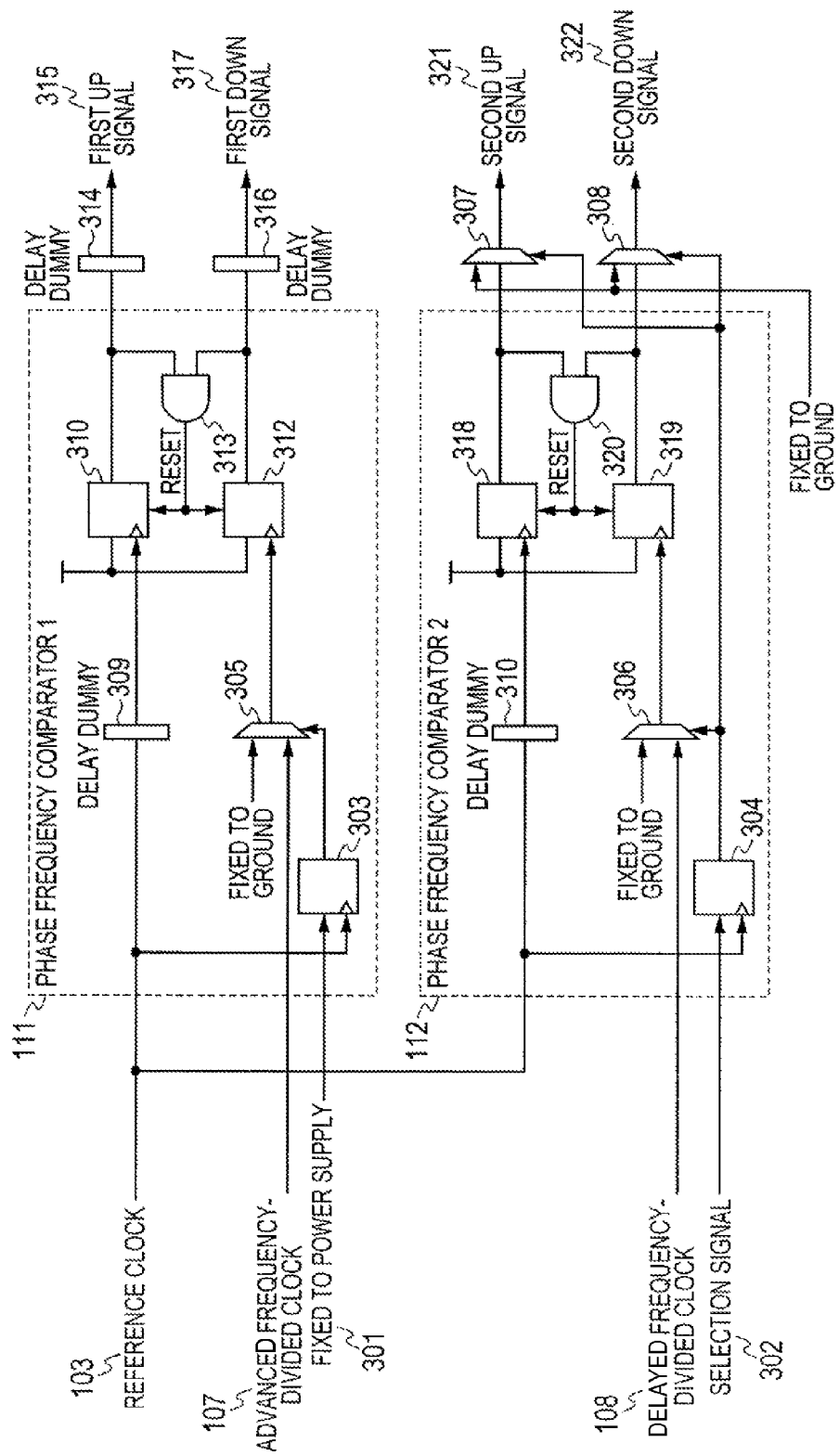
FIG. 3 is a block diagram showing an embodiment of a phase frequency comparator used in the embodiment of the phase locked loop of the present invention.

Next, an embodiment and an operation of a circuit configuration of each block will be explained below. FIG. 3 shows an embodiment of circuits of the first phase frequency comparator 111 and the second phase frequency comparator 112. While the reference clock 103 is used as a common input, the advanced frequency-divided clock 107 is inputted to the first phase frequency comparator 111 and the delayed frequency-divided clock 108 is inputted to the second phase frequency comparator 112.

The phase frequency comparator 111 inputs therein the reference clock 103 and a selection signal 301 and its outputs is equipped with a flip-flop 303 connected to a selection signal port of a selector 305. The phase frequency comparator 112 inputs therein the reference clock 103 and a selection signal 302 and its outputs is equipped with a flip-flop 304 connected to a selection signal port of a selector 306. Therefore, the phase frequency comparator 112 is configured to be able to switch the outputs of the selectors 305 and 306 to either of the clock inputs 107 and 108 or the ground, respectively, in synchronization with the reference clock 103. A flip-flop constituting the second phase frequency comparator 112 is connected to selection signal ports of selectors 307 and 308 each for switching the output and the ground of the second phase frequency comparator 112. The first phase frequency comparator 111 is configured so that the advanced frequency-divided clock 107 may be always selected by fixing the selection signal 301 to a power supply and is designed to have the same configuration as that of the second phase frequency comparator. This is for improving a phase equalizing accuracy over manufacture variation by making the circuit symmetrical together with the delay dummies 309 and 310.

Moreover, the first phase frequency comparator 111 has a latch 311 that uses the reference clock 103 having passed through the delay dummy 309 as a clock input and uses the power supply as a data input, a latch 312 that uses the output of the selector 305 as a clock input and uses the power supply as a data input, and an AND circuit 313 for resetting the latches 311 and 312 in response to the outputs of the latches 311 and 312, wherein the output of the latch 311 is outputted as a first up signal 315 through a delay dummy 314, and the output of the latch 312 is outputted as a first down signal 317 through a delay dummy 316.

The second phase frequency comparator 112 has a latch 318 that uses the reference clock 103 having passed through the delay dummy 310 as a clock input and uses the power supply as a data input, a latch 319 that uses the output of the selector 306 as a clock input and uses the power supply as a data input, and an AND circuit 320 for resetting the latches 318 and 319 in response to the outputs of the latches 318 and 319, wherein the output of the latch 318 is outputted as a second up signal 321 through the selector 307, and the output of the latch 319 is outputted as a second down signal 322 through the selector 308. Here, the delay dummies 314 and 316 were provided in order to improve the phase equalizing accuracy over the manufacture variation by making the circuit symmetrical.

The first up signal 315 and the first down signal 317 are inputted to the first charge pump 114. The second up signal 321 and the second down signal 322 are inputted to the second charge pump 115.

Figure 7:
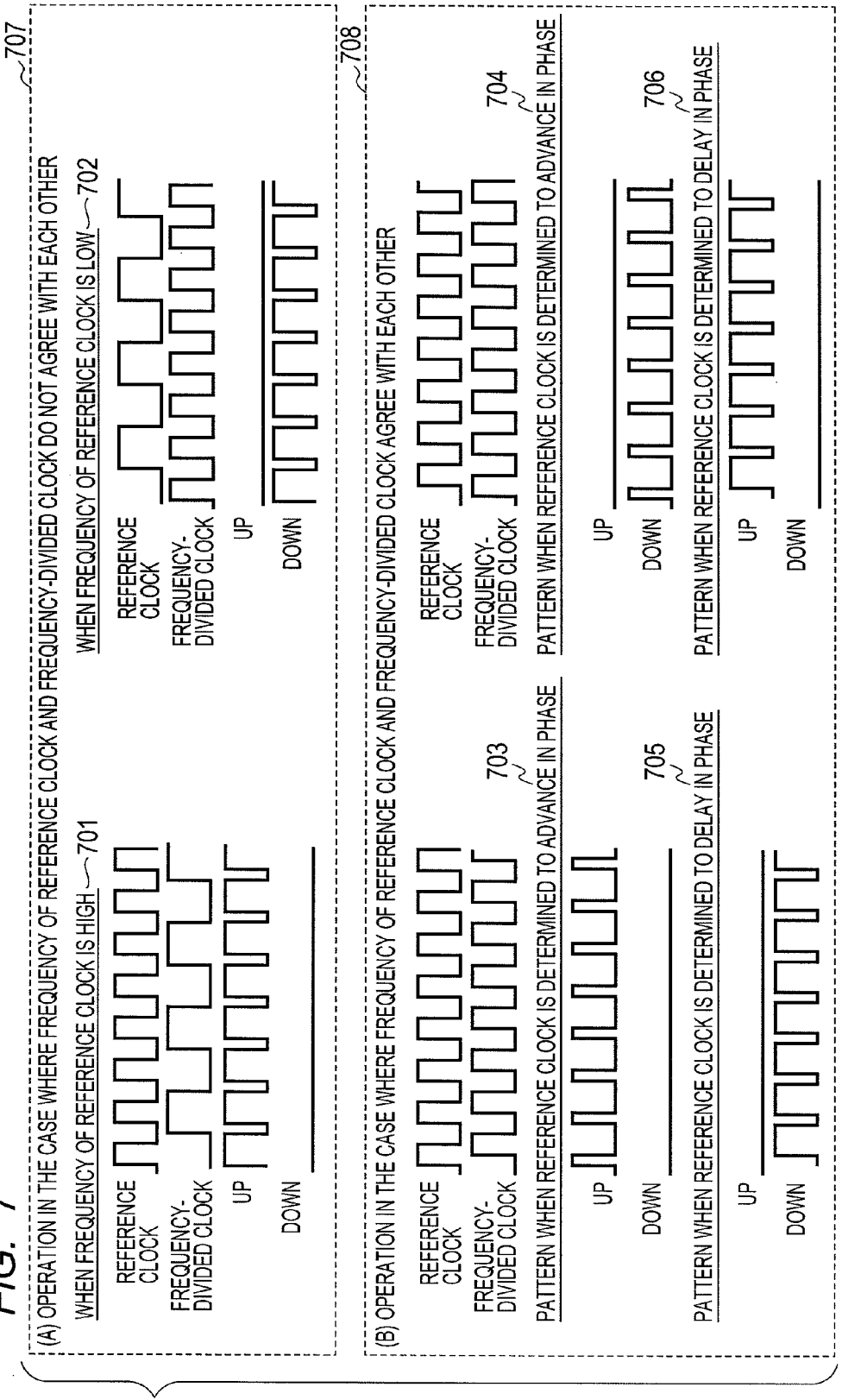
FIG. 7 is a diagram showing an operation of an example of a phase comparator used in the embodiment of the phase locked loop of the present invention.

FIG. 7 shows operation timings of the phase frequency comparators 111 and 112. A frequency comparison operation 707 when the frequencies are different and a phase comparison operation 708 when the frequency is the same but phases are different are shown in FIG. 7.

First, the frequency comparison operation 707 will be explained. In the case where the frequency of the reference clock 103 is high compared to the frequency of the frequency-divided clock, since the latches 311 and 313 are clocked with a larger number of clocks than the latches 312 and 318, the larger the frequency difference, the longer the output time of the frequency division ratio up signal becomes, as shown, by a pattern 701. On the other hand, in the case where the frequency of the reference clock 103 is lower than the frequency of the frequency-divided clock, the larger the frequency difference, the longer the output time of the frequency division ratio down signal becomes, as shown by a pattern 702.

Next, the phase comparison operation 708 will be explained. As shown by patterns 703 and 705, in the phase comparison operation, a pulse with a duration proportional to the phase difference is outputted, and two kinds of detection results are outputted for the same phase relationship. That is, a small delay and a large advanced frequency-divided clock, or a large delay and a large advanced frequency-divided clock belong to the same event, and differ in that whether a phase edge at which the phase comparison is performed is near or far in one cycle. Generally, the frequency synthesizer performs an operation that immediately after operation start, performs frequency comparison, and when the frequencies agree with each other, shifts to the phase comparison to reduce the phase difference. Since between which phase edges the phase difference is detected at the time of the phase comparison depends on states of the latches 311 and 312 when the frequency comparison changes to the phase comparison, it is not determinate. Then, in the phase locked loop 101, in order that two of the first and second phase frequency comparators perform the phase comparison operation on the same phase edge, it performs a control that will be described later using FIG. 11.

Figure 4:
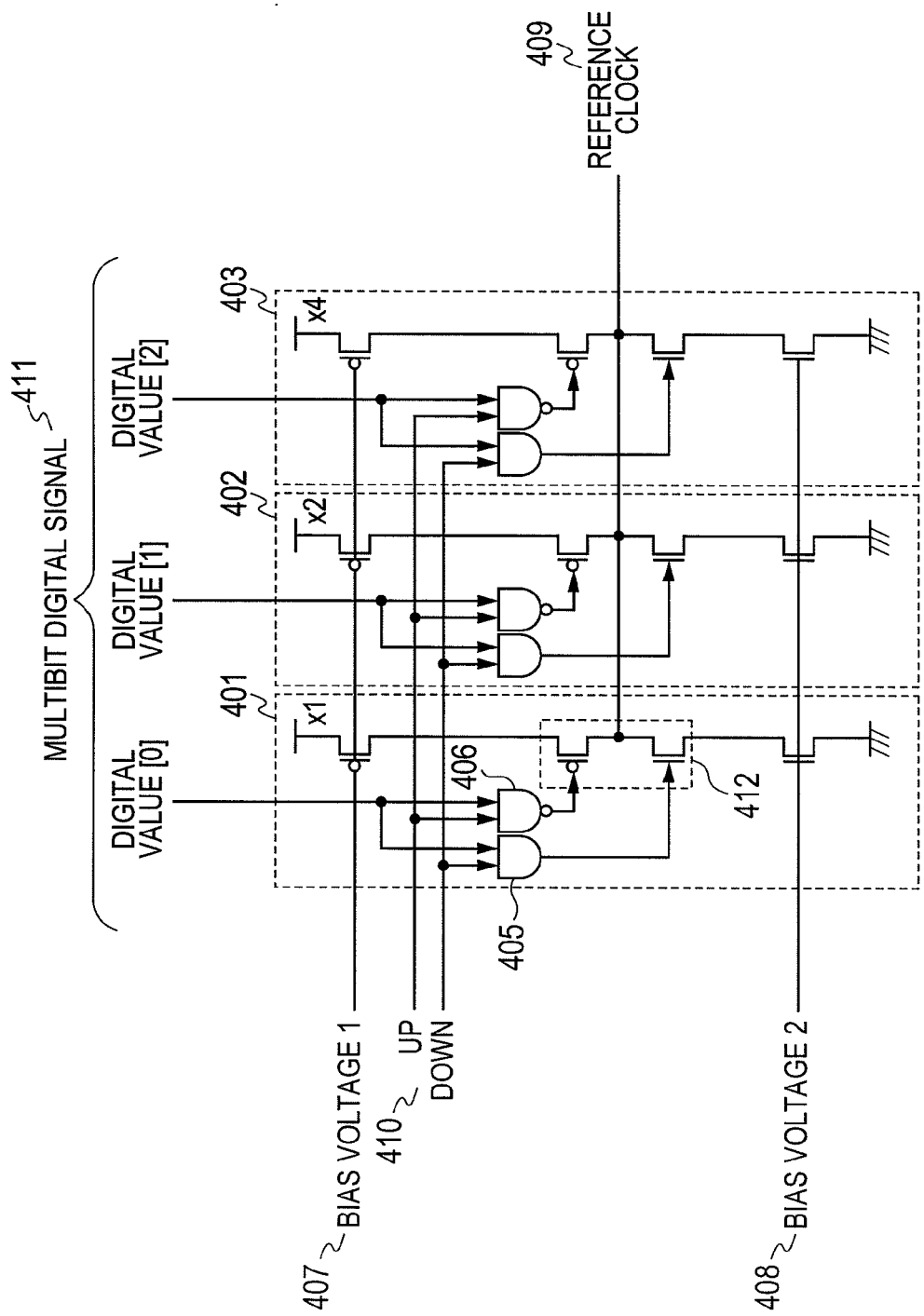
FIG. 4 is a diagram showing an example of a charge pump used in the embodiment of the phase locked loop of the present invention.

FIG. 4 shows embodiments of circuits of the first charge pump 114 and the second charge pump 115 in the case where a bus width of the integrator output signal 125 is three. Bias voltages 407 and 408 are supplied to a MOS gate, which constitutes a current source, and charging and discharging by a current output 409 that is inputted to the voltage controlled oscillator 106 through the low pass filter 116 are switched in response to an up/down signal 410 inputted from the first phase frequency comparator 111 or the second phase frequency comparator 112. Between the up/down signal 410 and a switch 412, an AND circuit 405 and a NAND circuit 406 are connected, and are configured so as to, if a multibit digital signal 411 inputted from the outside is logically 1, enter into an operation, and if it is 0, enter into a non-operation. Moreover, in the phase locked loop 101, since a binary expression is used as the multibit digital signal in order to suppress increases in circuit scale and electric power of the operators etc., the size of the charge pump is made to increase by powers of 2 using the size of bit 0 as a unit against an increase in the number of input bits.

Figure 8:
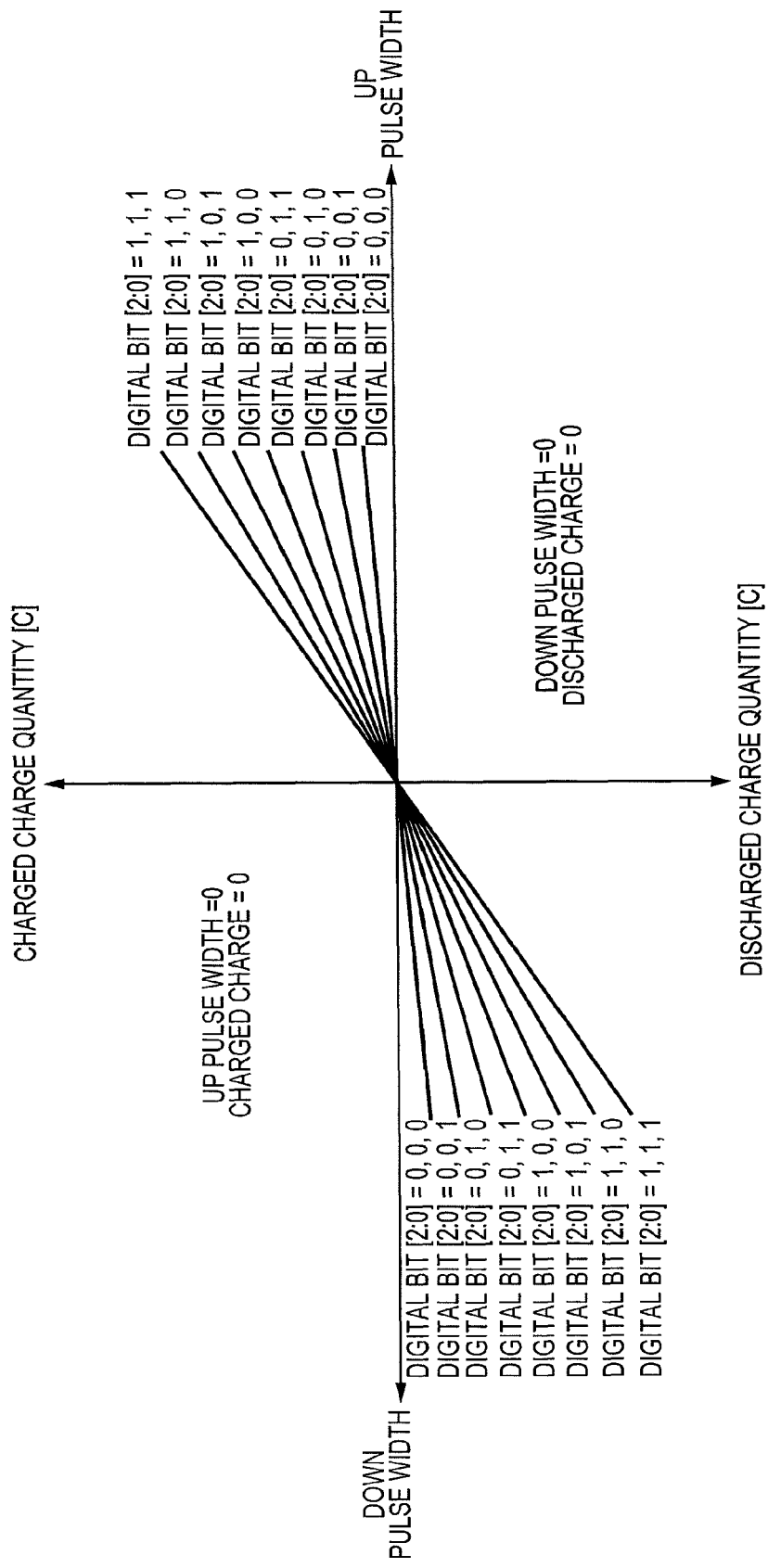
FIG. 8 is a diagram showing an operation of an example of the charge pump used in the embodiment of the phase locked loop of the present invention.

FIG. 8 shows a characteristic of a charged/discharged charge quantity as a function of an up/down pulse width for a case where the bus width of the multibit digital signal is three. The diagram shows that a charged/discharged charge quantity from charge pump 114 and 115 varies continuously to the input up/down pulse width while it varies discretely to different digital values.

Figure 9:
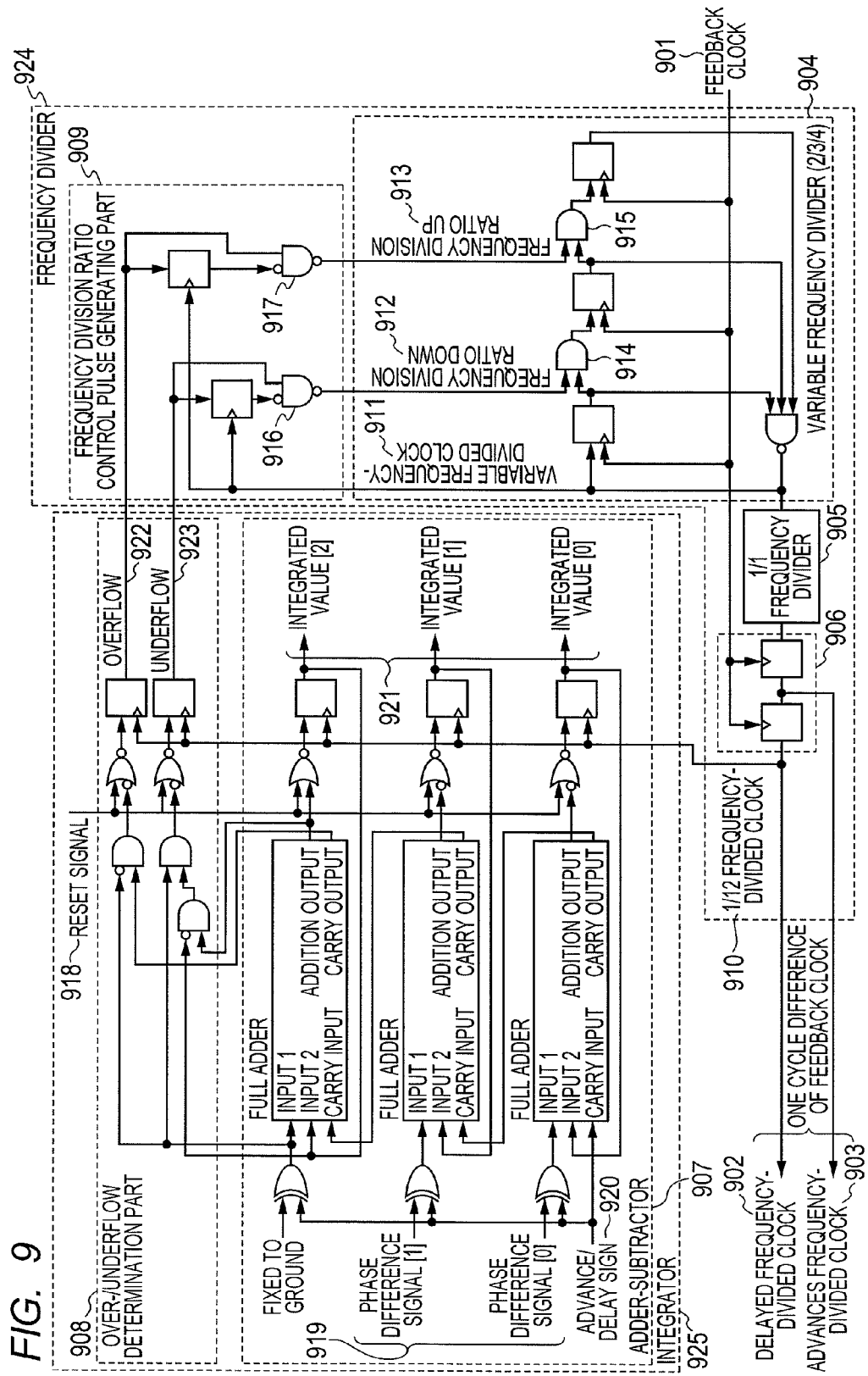
FIG. 9 is a diagram showing an example of an integrator and a frequency divider used in the embodiment of the phase locked loop of the present invention.

FIG. 9 shows embodiments of circuits of the integrator 119 and the frequency divider 110 for a case where the phase difference digital signal input 118 is two bits, an integrated value output is three bits, and a frequency division ratio is 1/12. A feedback clock 901 corresponds to the feedback clock 105 of FIG. 1, a delayed frequency-divided clock 902 corresponds to the delayed frequency-divided clock 108 of FIG. 1, and an advanced frequency-divided clock 903 corresponds to the advanced frequency-divided clock 107 of FIG. 1, respectively.

The feedback clock 901 is connected to a variable frequency divider 904, and the variable frequency divider 904 outputs a variable frequency-divided clock 911 to a 1/4 frequency divider 905 and a frequency division ratio control pulse generating part 909 in response to input of a frequency division ratio down signal 912 and a frequency division ratio up signal 913. An output of the 1/4 frequency divider 905 is connected to a shift register 906 operating at a timing of the feedback clock 901, which outputs the advanced frequency-divided clock 903 and the delayed frequency-divided clock 902 both of which have one cycle difference which is based on a period of the feedback clock 901. The delayed frequency-divided clock 902 is inputted to an adder-subtractor 907 and the overflow/underflow determination part 908, serving as an operation clock in each component. The adder-subtractor 907 is a circuit that inputs therein a 2-bit phase difference signal 919 expressed by a digital value and an advance/delay signal 920 for inputting the ground level at the time of advancement control or the power supply level at the time of delay control, and outputs a 3-bit integrated value 921. This embodiment exemplified an adder-subtractor in which full adders are ladder-connected. Moreover, when a reset signal 918 is at a power supply level, as a reset operation, the integrated value output is set to four that is a logically median value, that is: the integrated value [2] is fixed to the power supply level, the integrated value [1] is fixed to the ground level, and the integrated value [0] is fixed to the ground level.

FIG. 15 shows the operating timing charts of the overflow/underflow determination part 908, and the frequency division ratio control pulse generating part 909. The phase comparator 113 outputs the ground level as the advance/delay signal 920 when the feedback clock 105 is delayed to the receive data 104 and the power supply level as the advance/delay signal 920 when the feedback clock 105 is advanced from the receive data 104, and outputs the phase difference signal 919 having a 2-bit binary value as a gradation of the phase difference.

The adder-subtractor 907 performs an addition operation when the advance/delay signal 920 is at ground level, and performs a subtraction operation when the advance/delay signal 920 is at the power supply level. In the case 1501 where the integrated values are all at the power supply level and in addition when addition of a value more than or equal to unity is performed, it outputs an overflow signal 1502 during the operation clock, i.e., during one cycle of a 1/12 frequency-divided clock 910. Moreover, in the case 1503 where the integrated values are all at ground level and in addition when subtraction of a value more than or equal to unity is performed, it outputs an underflow signal 1504 during the operation clock, i.e., during one cycle of the 1/12 frequency-divided clock 910. An overflow signal 922 and an underflow signal 923 are outputted to the frequency division ratio control pulse generating part 909, which is made to generate pulses 1505 and 1506 of one cycle width of a 1/3 frequency-divided clock 911.

The ring counters constitute the variable frequency divider 904, which generates the variable frequency-divided clock 911 by the following procedures: when the frequency division ratio down signal 912 is at the power supply level and the frequency division ratio up signal 913 at ground level, the feedback clock 901 is counted three times; when the frequency division ratio down signal 912 and the frequency division ratio up signal 913 are at the power supply level, the feedback clock 901 is counted four times; and when the frequency division ratio down signal 912 is at ground level, the feedback clock 901 is counted two times. Usually, since the frequency division ratio down signal 912 is at the power supply level and the frequency division ratio up signal 913 is at ground level and since the overflow signal 922 and the underflow signal 923 are at ground level, the variable frequency divider 904 operates as a 1/3 frequency divider. When overflow occurs in an integrator 925, it operates as a 1/4 frequency divider, and when underflow occurs in the integrator 925, it operates as a 1/2 frequency divider.

Next, operations and controls of the phase locked loop 101 and the CDR circuit 102 will be explained below. Processes until the phase locked loop 101 generates an optimal clock for the CDR circuit 102 to take in the receive data 104 with the flip-flop 122 are shown by the following timing diagrams in order: a frequency locking process of the feedback clock 105 to the reference clock 103 in FIG. 10; a phase locking process of the feedback clock 105 to the reference clock 103 in FIG. 11; and a phase locking process to the receive data 104 in FIG. 12.

Figure 10:
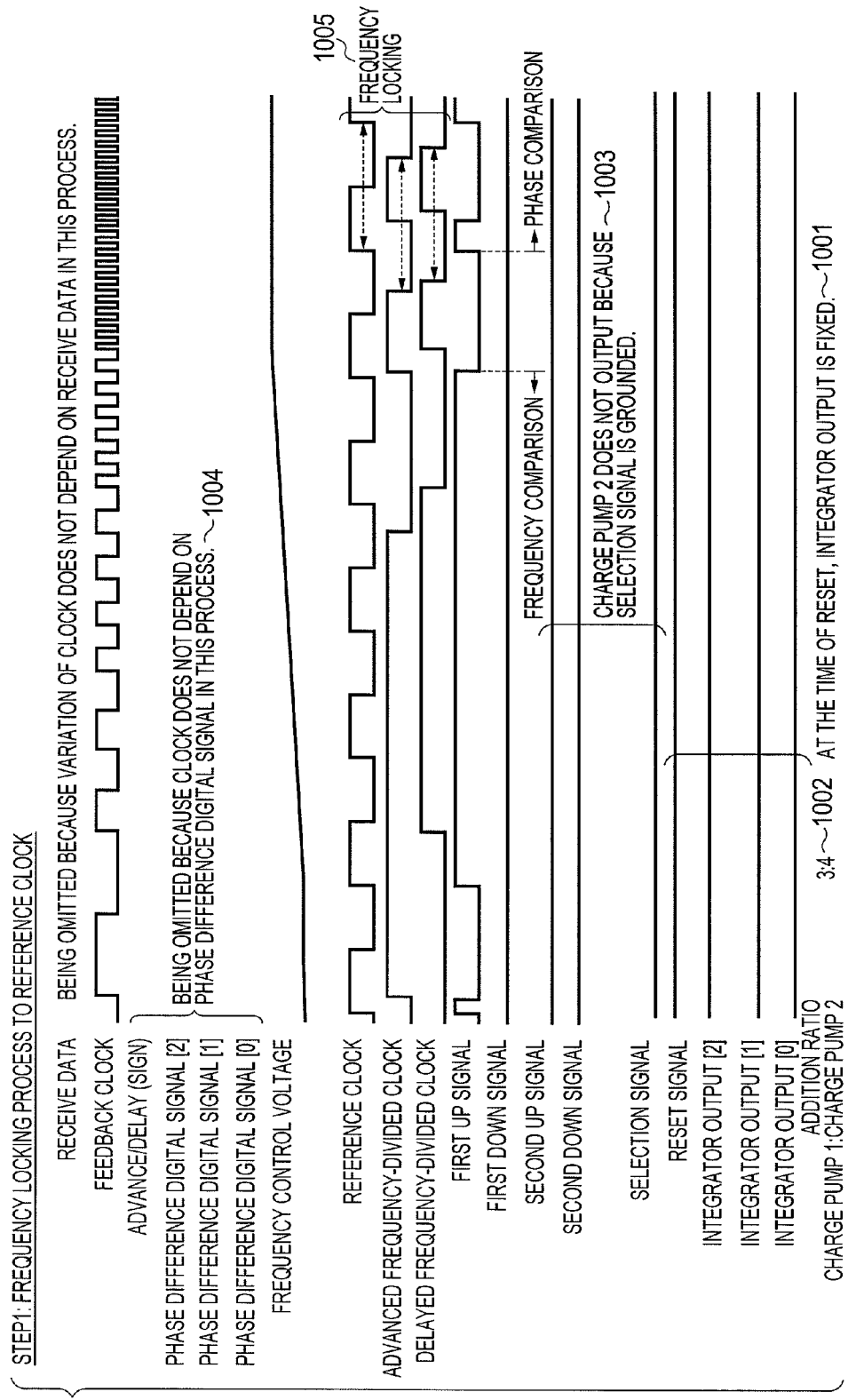
FIG. 10 is a diagram showing an operation of the embodiment of the phase locked loop of the present invention.

First, in the frequency locking process shown in FIG. 10, as shown in 1001, since the reset signal 123 of the integrator 119 is set to a reset state and the digital integrated value output of the integrator 119 is fixed to a logically median value, the output of the phase comparator 113 does not affect the operation for controlling the feedback clock 105 (1004). Moreover, since the output of the integrator 119 outputs the median value, an output ratio of the first charge pump 114 and the second charge pump 115 is being fixed to 3:4 as an exclusive ratio to a total value 7, as shown in 1002. Furthermore, the output of the phase frequency comparator 112 is stopped by grounding the selection signal 124, as shown in 1003, whereby the frequency and phase adjustment of the advanced frequency-divided clock 107 and the reference clock 103 inputted to the phase frequency comparator 111 become effective. In this case, since its circuit configuration is the same as that of a common frequency synthesizer making a single control loop and with the feedback clock 105 of a low frequency, a lot of the frequency up signals are outputted by the frequency comparison operation of the phase frequency comparator 111, and the reference clock 103 and the advanced frequency-divided clock 107 are frequency locked by a frequency acquisition operation (1005).

Figure 11:
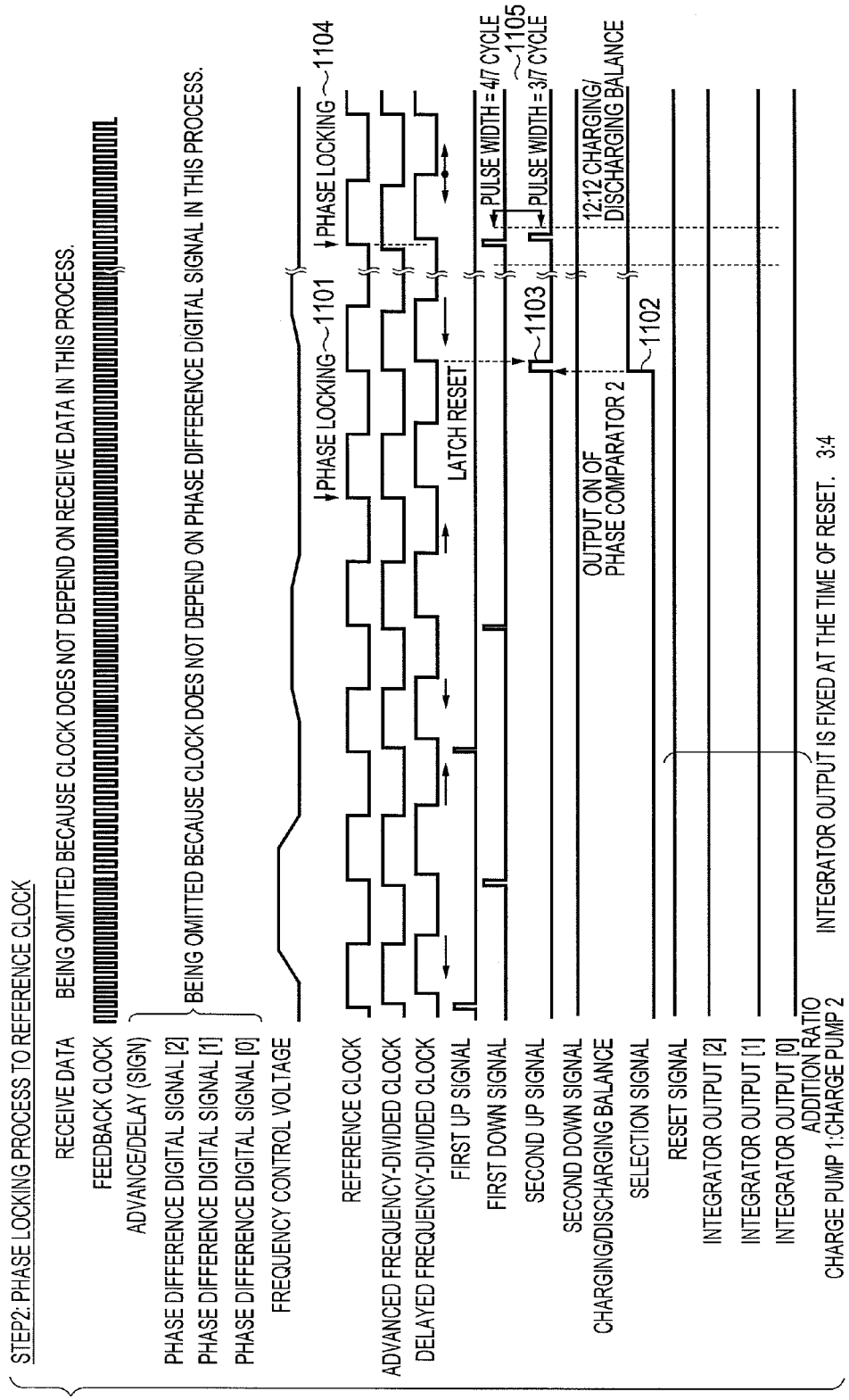
FIG. 11 is a diagram showing the operation of the embodiment of the phase locked loop of the present invention.

Next, in the phase locking process of the feedback clock 105 to the reference clock 103 of FIG. 11, the operation of the phase frequency comparator 111 automatically shifts from the frequency comparison to the phase comparison, and the reference clock 103 and the advanced frequency-divided clock 107 are phase locked (1101). After that, when the selection signal 124 is set to the power supply level, as shown in 1102, the selection signal is switched inside the phase frequency comparator 112 in synchronization with the reference clock, whereby the phase frequency comparator 112 starts to input therein the delayed frequency-divided clock 108 and at the same time starts to output the up/down signal thereof (1103). Since only the reference clock 103 is inputted to the phase frequency comparator 112 immediately before the delayed frequency-divided clock 108 is inputted, only the flip-flop connected to the frequency division ratio up signal output is in a state of outputting the power supply level; therefore, it starts to output the frequency division ratio up signal at the same time of input of the reference clock 103, as shown in 1103. After that, with the input of the delayed frequency-divided clock 108, the flip-flop connected to the up/down output will be reset. Since the phase of the feedback clock 105 advances by the up signal generated by the above-mentioned mechanism, the advanced/delayed frequency-divided clocks also advance in phase. Since a relationship between the advanced frequency-divided clock 107 and the reference clock 103 becomes a timing that the frequency-divided clock advances, the phase frequency comparator 111 outputs only a down pulse, whereas since a relationship between the delayed frequency-divided clock 108 and the reference clock 103 becomes a timing that the frequency-divided clock delays, the phase frequency comparator 112 outputs only an up pulse. At this time, since there is a difference of one cycle of the feedback clock 105 between the advanced frequency-divided clock 107 and the delayed frequency-divided clock 108, a total sum of an up pulse output time and a down pulse output time described above agree with one cycle of the feedback clock 105. Since the frequency synthesizer becomes stable in a state where the charged charge quantity and the discharged charge quantity flowing into the frequency control voltage 117 node are balanced, it locks the feedback clock 105 so that a product of a down pulse width of the phase frequency comparator 111 and a current of the charge pump 114 and a product of an up pulse width of the phase frequency comparator 112 and a current of the charge pump 115 may be balanced (1104). That is, the down pulse width of the phase frequency comparator 111 becomes 4/7 cycle and the up pulse width of the phase frequency comparator 112 becomes 3/7 cycle (1105).

Figure 12:
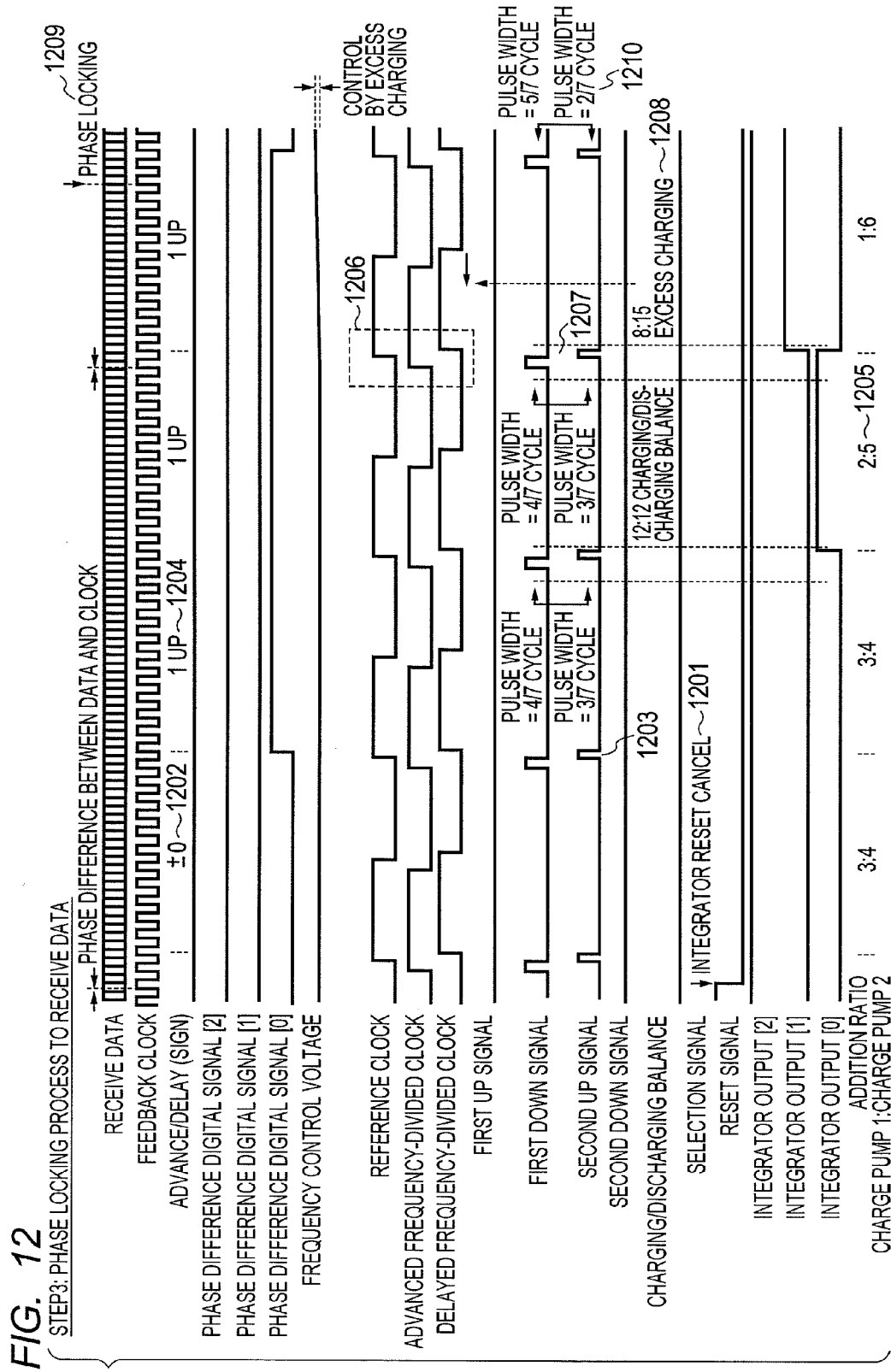
FIG. 12 is a diagram showing the operation of the embodiment of the phase locked loop of the present invention.

Next, in a phase locking process to the receive data of FIG. 12, the reset signal 123 is canceled (1201), the phase difference between the receive data 104 and the feedback clock 105 is detected by the phase comparator 113, and its result is reflected in an output value of the integrator 119. Here, a situation where the feedback clock 105 is delayed as the phase difference between the receive data 104 and the feedback clock 105 is illustrated. As shown in 1202, if the phase difference between the receive data 104 and the feedback clock 105 is not detected, the down pulse width of the phase frequency comparator 111 and the up pulse width of the phase frequency comparator 112 will maintain 4:3 (1203). When one up in a digital value is detected as the phase difference between the receive data 104 and the feedback clock 105 (1204), the output of the integrator 119 changes from four to five by an addition operation after one cycle. Therefore, the output ratio of the charge pump 114 and the charge pump 115 becomes 2:5 (1205). However, since a relationship between the reference clock 103 and the feedback clock 105 does not change (1206), a comparison result of the first and second phase frequency comparators occurring after the integration operation shows that a ratio of the down pulse width of the phase frequency comparator 111 and the up pulse width of the phase frequency comparator 112 still remains to be 4:3 (1207). As a result, a ratio of a product of the down pulse width of the phase frequency comparator 111 and the current of the charge pump 114 and a product of the up pulse width of the phase frequency comparator 112 and the current of the charge pump 115 becomes 8:5, which indicates excess charging (1208), and by a frequency of the voltage controlled oscillator 106 increasing, the advancement control is performed on the feedback clock 105. As a result of the control being performed, when the feedback clock 105 becomes advanced from the receive data 104, the down signal is outputted from the phase comparator 113 as a digital signal, the state becomes excess discharging, contrary to the above-mentioned phenomenon, and by the frequency of the voltage controlled oscillator 106 decreasing, the delay control is performed on the feedback clock. Therefore, by repeating the advancement control and the delay control based on the phase difference between the receive data 104 and the feedback clock 105, it becomes possible to lock the phase of the feedback clock to a phase variation of the receive data 104 (1209), and to take in correct data with the flip-flop 122. Incidentally, since the charging and the discharging are balanced in a locking state, the ratio of the down pulse width of the phase frequency comparator 111 and the up pulse width of the phase frequency comparator 112 agrees with the output ratio of the charge pump 115 and the charge pump 114.

As described above, based on the output of the phase comparator 113, the phase locked loop 101 can automatically perform the phase adjustment of the feedback clock 105 to the receive data 104 through the frequency control of the voltage controlled oscillator 106 by weighting respective outputs of the phase comparison results of the first phase frequency comparator 111 for comparing the phases of the advanced frequency-locked clock 107 and the reference clock 103 and the second phase frequency comparator 112 for comparing the phases of the delayed frequency-locked clock 108 and the reference clock 103, and outputting them to the voltage controlled oscillator 106. Here, since the frequency of the reference clock can be made smaller than the frequency of the receive data as shown in the receive data and the reference clock of FIG. 12, even if the receive data has a higher speed, a lower power consumption of the phase locked loop and the CDR circuit can be attained by using a lower speed reference clock.

Figure 13:
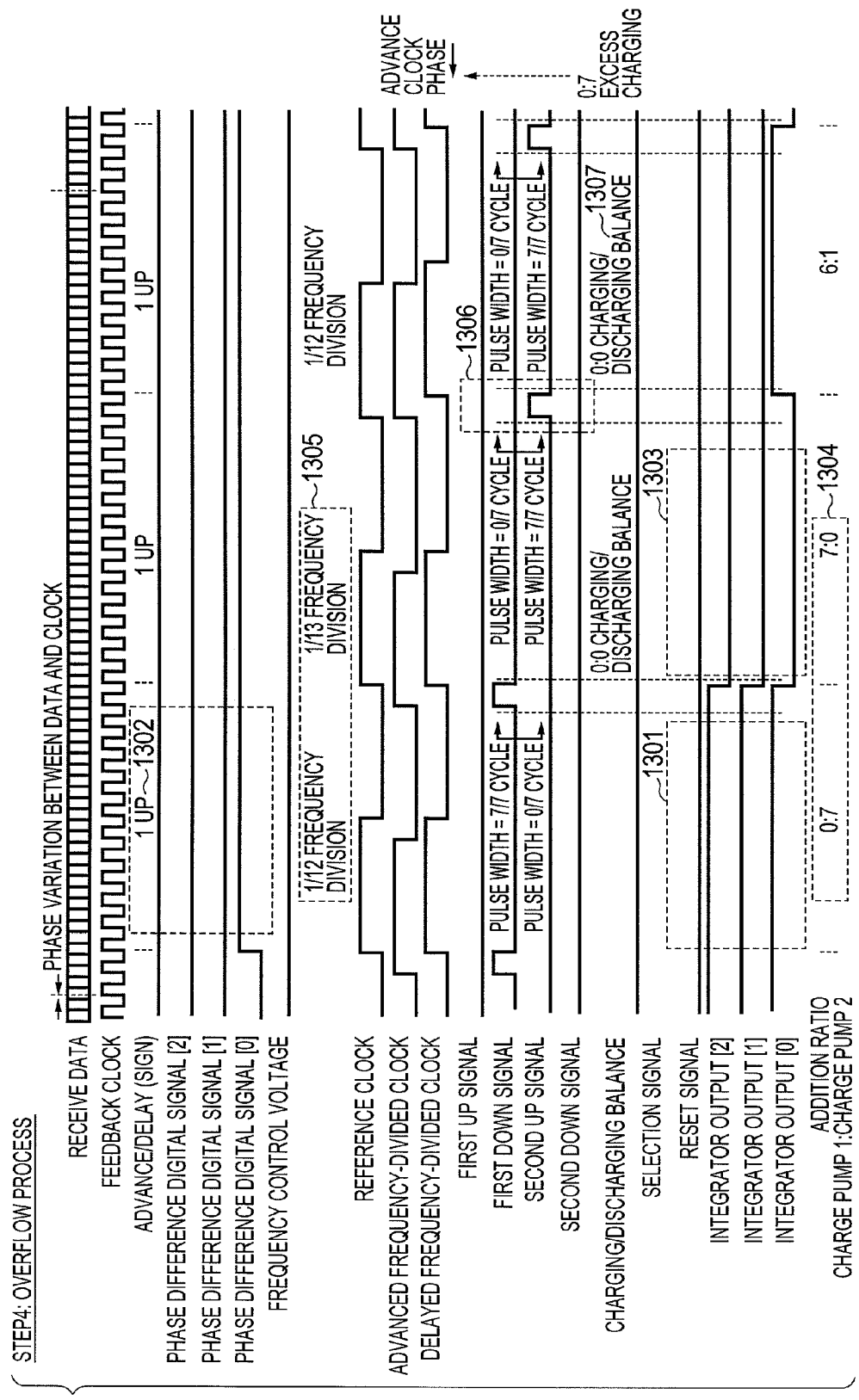
FIG. 13 is a diagram showing the operation of the embodiment of the phase locked loop of the present invention.

Next, operations at the time of the overflow and the underflow of the integrated value output of the integrator 119 will be explained. First, FIG. 13 shows a timing chart at the time of the overflow. When the integrator output is logically 7, namely, all the three bits are in a state of the power supply level (1301) and the phase of the feedback clock 105 is delayed to the receive data 104, the phase comparator 113 outputs the up signal (1302). As a result, the integrator output produces the overflow, becoming logically zero, namely, it becomes a state where all the three bits are at ground level (1303). In this case, an addition rate of the charge pump 114 and the charge pump 115 varies from 0:7 to 7:0 (1304). At the time of the overflow, since the 1/12 frequency-divided clock changes to a 1/13 frequency-divided clock as the operation is shown in FIG. 15 (1305), the phase timing of the frequency-divided clock will be delayed by one cycle which is based on a period of the feedback clock 105 in performing the phase comparison operation following later (1306). As a result, a situation where the charging and the discharging were balanced with a ratio of the down pulse width of the phase frequency comparator 111 and the up pulse width of the phase frequency comparator 112 of 7:0 and an output ratio of the charge pump 115 and the charge pump 114 of 7:0 changes to a situation where the charging and the discharging are balanced with a ratio of the down pulse width of the phase frequency comparator 111 and the up pulse width of the phase frequency comparator 112 of 0:7 and an output ratio of the charge pump 115 and the charge pump 114 of 0:7 (1307). Therefore, it operates satisfactorily also at the time of the overflow of the integrated value output.

Similarly, FIG. 14 shows a timing chart at the time of the underfloor. When the integrator output is logically zero, namely, all the three bits are in a state of the ground level (1401) and the phase of the feedback clock 105 is advanced from the receive data 104, the phase comparator 113 outputs the frequency division ratio down signal (1402). As a result of this, the output of the integrator 119 produces the underflow and becomes logically seven, namely, all the three bits are in a state of the power supply level (1403). In this case, the addition rate of the charge pump 114 and the charge pump 115 changes from 7:0 to 0:7 (1404).

At the time of the underflow, since the 1/12 frequency-divided clock changes to a 1/11 frequency-divided clock as the operation is shown in FIG. 15 (1405), the phase timing of the frequency-divided clock will be advanced by one cycle from the feedback clock 105 in doing the phase comparison operation following later (1406). As a result, a situation where the charging and the discharging were balanced with a ratio of the down pulse width of the phase frequency comparator 111 and the up pulse width of the phase frequency comparator 112 of 0:7 and an output ratio of the charge pump 115 and the charge pump 114 of 0:7 changes to a situation where the charging and the discharging are balanced with a ratio of the down pulse width of the phase frequency comparator 111 and the up pulse width of the phase frequency comparator 112 of 7:0 and an output ratio of the charge pump 115 and the charge pump 114 of 7:0 (1407). Therefore, it operates satisfactorily even at the time of the underflow of the integrated value output.

Generally, in the system of performing a serial transmission, a frequency deviation arises between the reference clock 103 and the receive data 104. In order to correct the deviation, the integrator of the CDR circuit 102 always needs the up signal or down signal. As a result, although the overflow and the underflow will certainly occur, it operates satisfactorily by varying the frequency division ratio, as described above using FIG. 15.

Moreover, in the phase locked loop 101 of this embodiment, since a follower control to the phase variation of target receive data that is to be phase locked is performed through the low pass filter 116 in the phase locking loop of the frequency synthesizer, the output of the voltage controlled oscillator is not phase modulated abruptly. Therefore, it is possible to prevent a malfunction of the phase locked loop 101 caused by disturbance or a noise.

Second Embodiment

In a second embodiment, an embodiment of a receiving circuit with a plurality of serial channels equipped with the CDR circuit 201 of the first embodiment will be explained.

Figure 2:
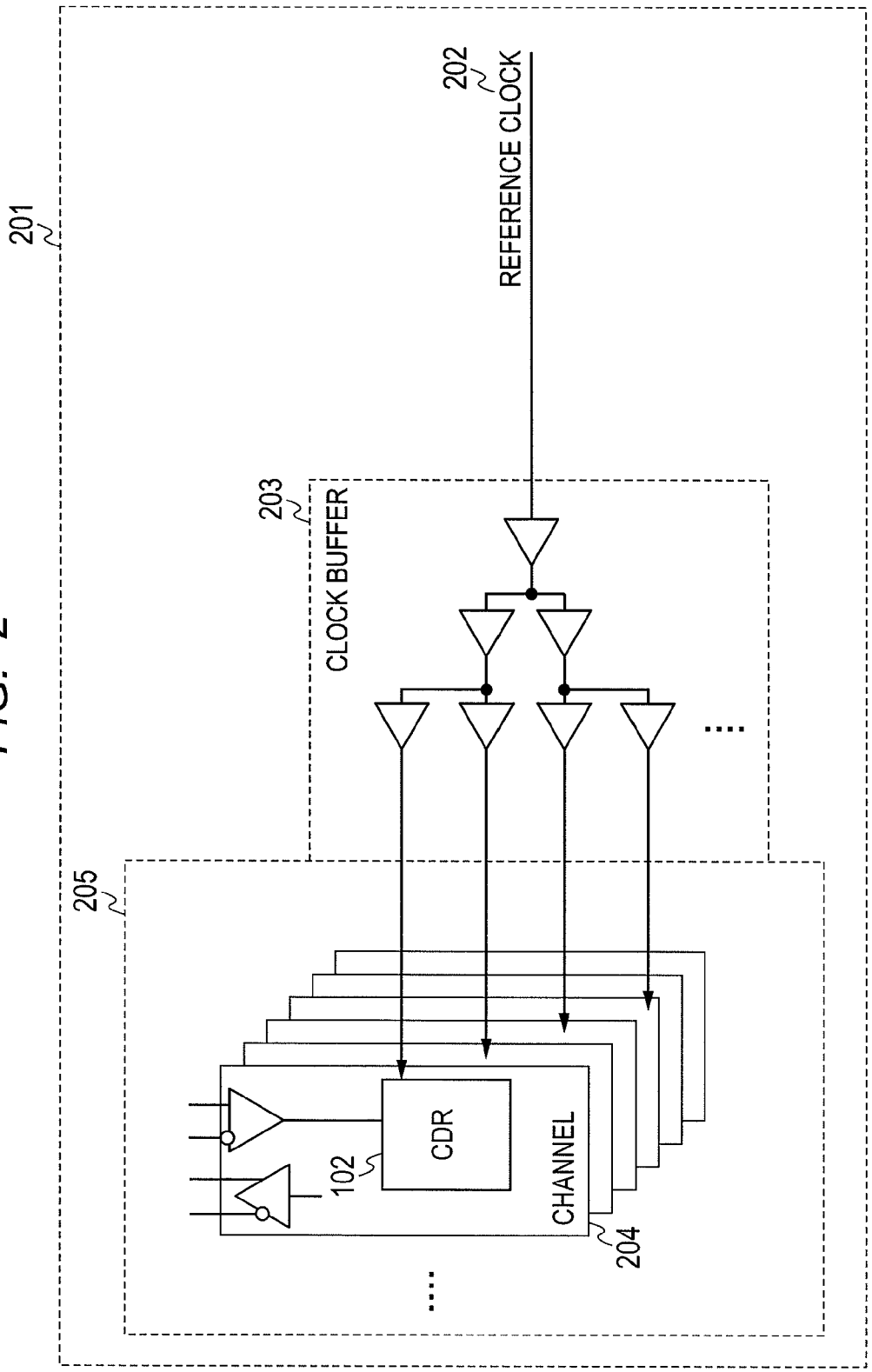
FIG. 2 is a block diagram showing an embodiment of a receiving circuit of the present invention.

FIG. 2 shows a configuration example of a receiving circuit 201 with a plurality of serial channels equipped with the phase locked loop 101 and the CDR circuit 102 of the first embodiment. The receiving circuit 201 has a clock buffer 203 for distributing the reference clock 202 and a receiving part 205 equipped with a plurality of serial channels 20 each mounting thereon the CDR circuit 102 operating at the reference clock 202 supplied from the outside.

Since the CDR circuit 102 operates at the reference clock of a low speed compared to the receive data, the reference clock can be set to a low speed compared to the receive data, and thereby an increase in power consumption when distributing the reference clock 202 through the clock buffer 203 can be suppressed.

Third Embodiment

In a third embodiment, a phase locked loop for automatically correcting a steady phase error by inputting clocks having a steady phase difference as the receive data of the first embodiment.

Figure 5:
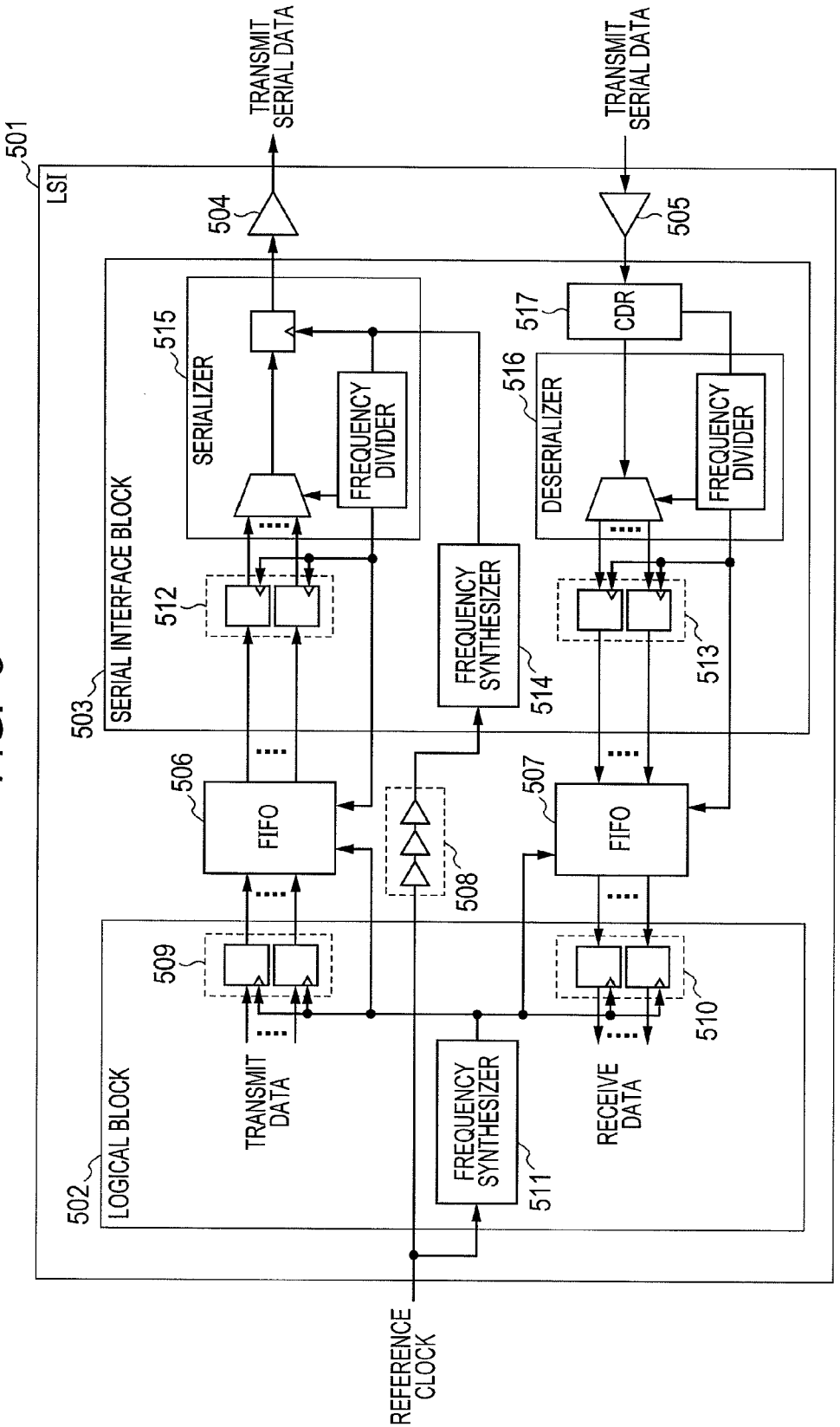
FIG. 5 is a diagram showing an example of a circuit block of an LSI equipped with a high-speed serial interface in the case where the phase locked loop of the present invention is not applied.

First, FIG. 5 shows a circuit block diagram of an LSI 501 equipped with a high-speed serial interface that does not use the phase locked loop of the present invention examined by the inventors of this application. The LSI 501 has a receive buffer 505 and a transmit buffer 504 for exchanging serial data with the outside of the LSI 501, a serial interface block 503 for converting high-speed serial data into low-speed parallel data, a logical block 502 for performing a logic calculation processing on the parallel data, FIFO's 506 and 507 each for adjusting a clock timing between the logical block 502 and the serial interface block 508 and transferring the parallel data, and a clock buffer 508 for distributing a reference clock to the logical block 502 and the serial interface block 508.

The logical block 502 is equipped with a frequency synthesizer 511 for generating an operation clock and flip-flops 509 and 510 for retaining data. The serial interface block 503 has a frequency synthesizer 514 for generating an operation clock, a CDR circuit 517 for generating the optimal clock for taking in the receive data, a deserializer 516 for converting the taken-in serial data into parallel data, a serializer 515 for converting the taken-in parallel data into serial data, and flip-flops 512 and 513 each for retaining data.

Generally, the operation clock of the logical block 502 and the operation clock of the serial interface block 503 have a statistic phase difference, that is generated to the reference clocks inputted to the frequency synthesizers 511 and 514 due to a delay time generated at the buffer 508. Since the above-mentioned delay depends on the manufacture variation etc., in transferring medium- to high-speed data between the logical block 502 and the serial interface block 503, a circuit for automatically correcting the above-mentioned phase difference becomes necessary. Although the FIFO is generally used as such a circuit, the electric power and the area become larger because of an additional circuit.

Figure 6:
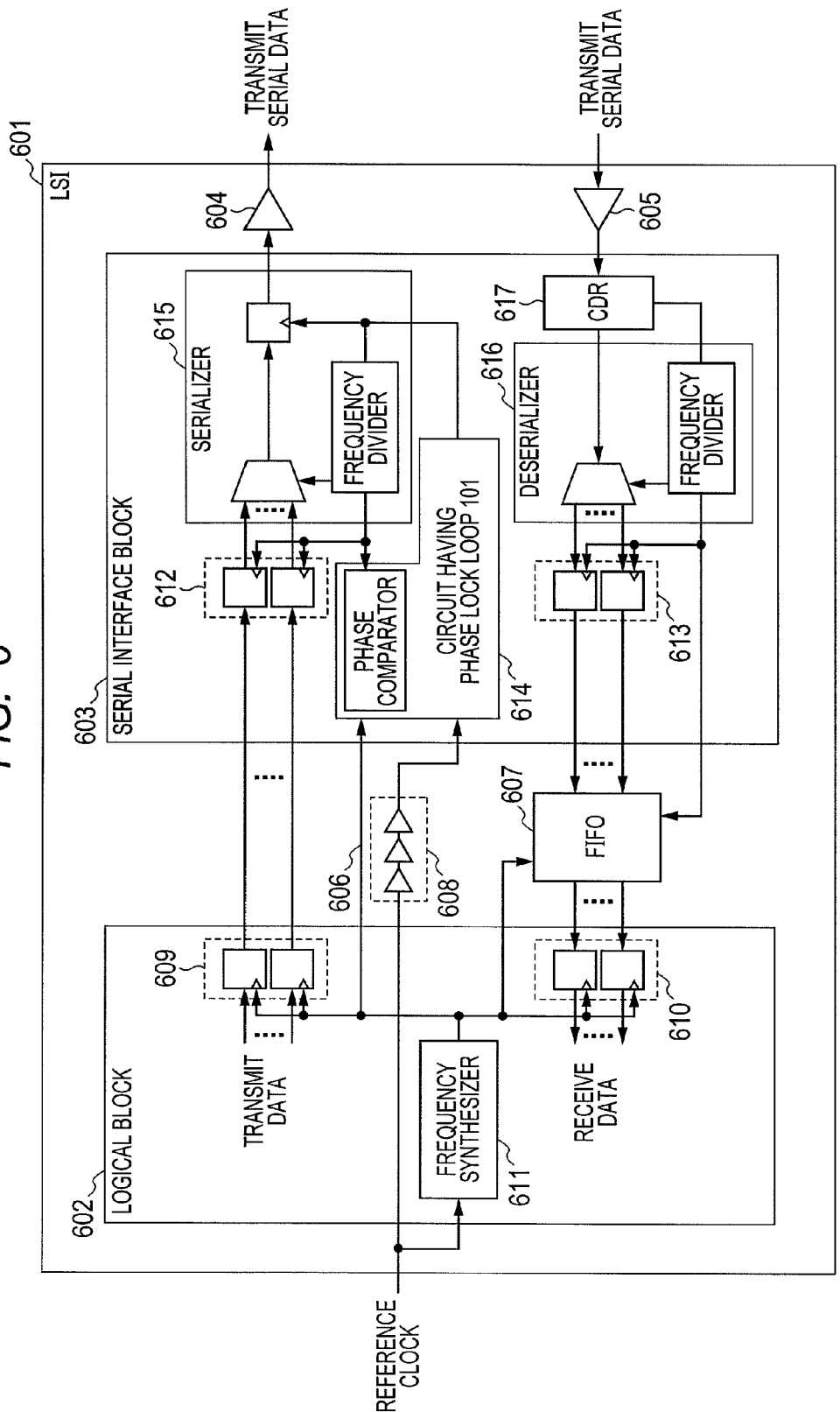
FIG. 6 is a diagram showing an example of the circuit block of the LSI equipped with the high-speed serial interface in the case where the phase locked loop of the present invention is applied.

Next, FIG. 6 shows a block diagram of an LSI 601 of this embodiment. In the LSI 601, a frequency synthesizer of a serial interface block 603 is replaced with a circuit 614 that has on it the phase locked loop 101 of the first embodiment, which inputs therein a clock 606 of a logical block as the receive data 104. In the circuit of the first embodiment, since the feedback clock 105 that is phase-locked to the receive data 104 is generated, a phase difference between the operation clock of a data taking-in side flip-flop 612 and the operation clock of a data-outputting side flip-flop 609 will be automatically corrected. In the case where the flip-flops 609 and 612 to be phase locked are placed being physically away from each other, it is possible to suppress an influence of a delay time difference. In the LSI 601 of this embodiment, since the additional circuit is unnecessary to the phase locked loop of the first embodiment, it is possible to reduce an area of the circuit in addition to an effect of electric power reduction.

What is claimed is:

1. A phase locked loop for phase locking a receive signal and a feedback clock, comprising:
    a voltage controlled oscillator for generating the feedback clock;
    a frequency divider for generating a first frequency-divided clock and a second frequency-divided clock from the feedback clock;
    a first phase comparator to which a reference clock and the first frequency-divided clock are inputted;
    a second phase comparator to which the reference clock and the second frequency-divided clock are inputted; and
    a third phase comparator to which the feedback clock and the receive signal are inputted;
    wherein there is a phase difference of at least one cycle of the feedback clock between the first frequency-divided clock and the second frequency-divided clock, and an output of the first phase comparator and an output of the second phase comparator are weighted based on an output of the third phase comparator and are inputted to the voltage controlled oscillator.

2. The phase locked loop according to claim 1, wherein a frequency of the reference clock is lower than a frequency of the receive signal.

3. The phase locked loop according to claim 1, wherein there is a phase difference of one cycle of the feedback clock between the first frequency-divided clock and the second frequency-divided clock.

4. The phase locked loop according to claim 1, wherein the weighted input to the voltage controlled oscillator is inputted through a low pass filter.

5. The phase locked loop according to claim 1, wherein the first phase comparator is a phase frequency comparator.

6. The phase locked loop according to claim 1, wherein the second phase comparator is a phase frequency comparator.

7. A CDR circuit, comprising:
    the phase locked loop according to claim 1.

8. A receiving circuit, comprising a plurality of serial channels,
    wherein each of the serial channels has the CDR circuit according to claim 7.

9. The receiving circuit according to claim 8,
    wherein a frequency of the reference clock is lower than a frequency of the receive signal.

\* \* \* \* \*